(12) United States Patent
Casagrande et al.

(10) Patent No.: US 12,407,297 B2
(45) Date of Patent: Sep. 2, 2025

(54) METHOD FOR OPERATING A FAST START-UP OSCILLATOR SYSTEM, AND FAST START-UP OSCILLATOR SYSTEM

(71) Applicant: The Swatch Group Research and Development Ltd, Marin (CH)

(72) Inventors: Arnaud Casagrande, Bole (CH); Jean-Luc Arend, Corcelles (CH)

(73) Assignee: The Swatch Group Research and Development Ltd, Marin (CH)

( * ) Notice: Subject to any disclaimer, the term of this patent is extended or adjusted under 35 U.S.C. 154(b) by 11 days.

(21) Appl. No.: 18/407,528

(22) Filed: Jan. 9, 2024

(65) Prior Publication Data

US 2024/0275333 A1   Aug. 15, 2024

(30) Foreign Application Priority Data

Feb. 10, 2023   (EP) ..................................... 23155972

(51) Int. Cl.
*H03B 5/06* (2006.01)
*H03B 5/32* (2006.01)
(Continued)

(52) U.S. Cl.
CPC ................ *H03B 5/06* (2013.01); *H03B 5/32* (2013.01); *H03K 3/014* (2013.01); *H03K 3/0307* (2013.01);
(Continued)

(58) Field of Classification Search
CPC ................ H03B 5/06; H03B 5/30–368; H03B 2200/0094; H03K 3/014; H03L 3/00
See application file for complete search history.

(56) References Cited

U.S. PATENT DOCUMENTS 6,819,195 B1   11/2004   Blanchard et al.
10,581,378 B1   3/2020   Verhoef
(Continued)

FOREIGN PATENT DOCUMENTS

WO   WO 2015/179429 A1   11/2015

OTHER PUBLICATIONS

European Search Report issued Aug. 15, 2023 in European Application 23155972.5 filed on Feb. 10, 2023, 3 pages (with English Translation of Categories of Cited Documents).

*Primary Examiner* — Levi Gannon
(74) *Attorney, Agent, or Firm* — Oblon, McClelland, Maier & Neustadt, L.L.P.

(57) ABSTRACT

A method for operating a fast start-up oscillator system, which includes a reference oscillator and a quartz oscillator connected to an electronic oscillator circuit, which is provided to supply a master clock signal to a start-up controller configured to perform a fast start-up procedure of the quartz oscillator via the reference oscillator. The start-up controller includes a calculation unit and a memory unit for storing data in connection with the reference oscillator for starting the quartz oscillator. The method includes parameterising the calculation unit for starting the quartz oscillator, generating excitation bursts, determining a phase deviation in different successive periods between the oscillation of the reference oscillator and the oscillation of the quartz oscillator, calculating a frequency error in the calculation unit, and correcting the frequency of the reference oscillator to the frequency of the quartz oscillator.

11 Claims, 6 Drawing Sheets

(51) Int. Cl.
*H03K 3/014* (2006.01)
*H03K 3/03* (2006.01)
*H03L 3/00* (2006.01)

(52) U.S. Cl.
CPC ........ *H03L 3/00* (2013.01); *H03B 2200/0094* (2013.01)

(56) References Cited

U.S. PATENT DOCUMENTS

| | | | |
|---|---|---|---|
| 10,951,166 B1* | 3/2021 | Kruiskamp | H03B 5/06 |
| 11,245,362 B1* | 2/2022 | Casagrande | H03B 5/06 |
| 2009/0015342 A1* | 1/2009 | Kleveland | H03B 5/06 |
| | | | 331/116 R |
| 2015/0333694 A1 | 11/2015 | Griffith et al. | |
| 2016/0308491 A1* | 10/2016 | Elgaard | H03L 3/00 |
| 2020/0099337 A1 | 3/2020 | Powell et al. | |
| 2021/0273643 A1* | 9/2021 | Tsutsumi | H03L 7/093 |

* cited by examiner

METHOD FOR OPERATING A FAST
START-UP OSCILLATOR SYSTEM, AND
FAST START-UP OSCILLATOR SYSTEM

CROSS-REFERENCE TO RELATED APPLICATION

This application claims priority to European Patent Application No. 23155972.5 filed on Feb. 10, 2023, the entire disclosure of which is hereby incorporated herein by reference.

TECHNICAL FIELD

The invention relates to a method for operating an oscillator system, having a quartz oscillator and a reference oscillator, with fast start-up and phase-locked operation.

The invention also relates to an oscillator system intended to be operated by the drive method.

TECHNOLOGICAL BACKGROUND

In a fast start-up quartz oscillator system, as described in patent applications EP 3 965 290 A1 or EP 3 965 291 A1, the frequency of a CMOS-type reference oscillator is calibrated during the test phase after the circuit has been assembled. This frequency has a certain error compared with that of the quartz oscillator, and this error tends to change naturally over time depending on the different PVT conditions of the integrated circuit, and also depending on the ageing criteria of the quartz used.

U.S. Pat. No. 10,951,166 B1 describes an oscillator circuit that generates an oscillating voltage signal when switched on. The quartz of the oscillator has a first electrode and a second electrode. The oscillator circuit has a power supply source with a power supply terminal and a reference terminal. The oscillator circuit includes a switching circuit, which is arranged between the power supply source and the quartz. The switching circuit, in a start-up phase, alternately connects the power supply terminal of the power supply voltage source to the first electrode and the second electrode of the quartz so as to have an increase in the amplitude of the oscillating voltage signal. Although this document provides for a fast start-up of the oscillator circuit, there are nevertheless various switchings of the oscillator stage, which in general does not allow a fast start-up to be carried out precisely with a good accuracy of the oscillation frequency, which is a disadvantage.

FIG. 1 shows an embodiment of a quartz oscillator system 10 as described in EP 3 965 291 A1. The oscillator 11 comprises a quartz resonator 12 connected to an electronic oscillator circuit 14. The quartz resonator 12 is electrically coupled to the electronic oscillator circuit 14. Typically, the quartz resonator 12 is connected in parallel to the electronic oscillator circuit 14. The oscillator structure 11 comprises a first terminal 13 and a second terminal 15, which are connected to the first and second terminals of the quartz resonator 12 and the electronic oscillator circuit 14 respectively. The output terminal 50 of the electronic oscillator circuit 14 is provided to supply a master clock signal in order to be used by an electronic device, which may be a watch worn by a user.

The quartz oscillator system 10 further comprises a start-up controller 16 configured and operable to perform a fast oscillation start-up procedure with the quartz oscillator 10. The start-up controller 16 generally comprises a processor 25 as well as a memory 26 and an additional or storage memory 27. The quartz oscillator 10 is further equipped with a comparator 30, which comprises a first input terminal 31 connected to the first terminal 13. The comparator further comprises a second input terminal 32 connected to the second terminal 15 of the oscillator structure 11. The master clock signal may also be present or may be fed back to the start-up controller 16.

The quartz oscillator system 10 further comprises a synchroniser 35. The synchroniser 35 comprises an input terminal also referred to as a synchronisation input 37 or comparator output. The input of the synchroniser 37 is directly connected to an output terminal 33 of the comparator 30. In this way, a comparative signal indicating a comparison of the first and second oscillation signals present at the first and second terminals 13, 15 can be supplied to the synchroniser 35.

The quartz oscillator system 10 further comprises an oscillator 45, generally implemented as an RC oscillator. The operation of the oscillator 45 can be governed by the start-up controller 16. Here, many frequencies for driving the oscillator 45 can be stored in the storage unit 26. The oscillator 45 is further connected or coupled to a phase-locked loop 55 (PLL). The phase-locked loop 55 comprises an output terminal 56 connected to a clock input 38 of the synchroniser 35. The output terminal 56 of the phase-locked loop 55 and an output terminal 36 of the synchroniser 35 are connected individually or coupled to respective input terminals 72, 71 of a phase shift unit 70. The phase shift is coupled to a digital memory 27.

The digital memory 27 may be supplied with a look-up table 28. As shown in FIG. 1, the phase shift unit 70 is coupled to the digital storage 27 and is therefore configured to read or retrieve digital data stored in the digital storage 27. Generally, the digital data provided by the digital storage indicates or characterises a switching delay of the comparator 30. In this way, the switching delay of the comparator 30 and therefore the effect or impact of the comparator 30 dispersion of the comparative signal generated by the comparator 30 can be effectively compensated by the phase shift unit 70. The phase shift unit 70 comprises an output terminal 73 connected to the start-up controller 16.

The signals supplied to the output terminal 73 and fed back to the start-up controller 16 can be used as timing signals by which the start-up controller 16 and/or its processor 25 triggers the generation of an oscillation signal.

In FIG. 1, the start-up controller 16 comprises a phase output 17 connected to first and second logic gates 51, 52. The input of the second logic gate 52 is inverted by an inverter 60 with respect to the input of the first logic gate 51. The two logic gates 51, 52 are further connected to a start-up control output 18. An output of the first and second logic gates 51, 52, which are for example AND logic gates, is connected or coupled to the first and second buffer amplifiers 41, 42. The respective outputs of the first and second buffer amplifiers 41, 42 are connected to the first and second capacitors 21, 22. The capacitors 21, 22 are driven in a phase-shifted mode by the start-up controller 16.

SUMMARY OF THE INVENTION

The present invention relates to a method for operating a fast start-up oscillator system with phase-locking of the reference oscillator by overcoming the disadvantages mentioned in the prior art.

The present invention also relates to an electronic system operated by the method for driving the fast start-up oscillator system so as to phase-lock in order to correct a frequency error of a reference oscillator of the oscillator system, thereby overcoming the aforementioned disadvantages of the prior art.

An advantage of the system or method for operating the oscillator system is that, on the one hand, the frequency of the reference oscillator is constantly present during the start-up phase of the quartz oscillator, that is to say the reference oscillator can always be maintained switched on or at least before the quartz oscillator is started up. On the other hand, the phase of this reference oscillator is successively realigned with the free oscillation phase of the quartz oscillator. Under these conditions, it is possible to use only the phase variation obtained at each phase realignment to deduce a frequency difference. This frequency difference can thus be used to correct the frequency of the reference oscillator. It is possible to correct a frequency error margin of ±1%, particularly in relation to the frequency of the quartz oscillator switched on.

Once the reference oscillator has been frequency corrected by determining the phase deviation at each phase realignment period in the start-up time of the quartz oscillator, the quartz oscillator is no longer maintained by the reference oscillator, which is preferably an RC oscillator. However, the next start-up of the quartz oscillator will be improved.

Advantageously, it is easier to determine a phase deviation between the reference oscillator and the quartz oscillator and then to easily determine the frequency deviation for correcting the oscillation frequency of the reference oscillator at each phase realignment. Mainly, the phase variation obtained at each phase realignment is used to deduce a frequency difference for correcting the frequency of the reference oscillator.

Never before has it been conceivable to directly use the phase deviation to directly and easily correct the frequency deviation or error between the reference oscillator and the quartz oscillator. Thus, the present invention therefore presents the oscillator system wherein the reference oscillator can be operated continuously so as to determine any phase deviation between the reference oscillator and the quartz oscillator, enabling the frequency error to be determined quickly by means of a derivative in order to correct the frequency of the reference oscillator.

BRIEF DESCRIPTION OF THE FIGURES

The purposes, advantages and features of a fast start-up oscillator system with phase or frequency lock will become clearer in the following non-limiting description with reference to the drawings wherein.

DETAILED DESCRIPTION OF THE INVENTION

The following description describes all the components of a fast start-up oscillator system with predominantly phase-locked control to enable a frequency error of a reference oscillator to be corrected on the basis of a quartz oscillator to be switched on via the reference oscillator and a start-up controller. The main purpose of this invention is to measure a phase deviation in successive drive or excitation periods when starting the quartz oscillator, so as to correct a frequency error between the frequency of the quartz oscillator and the frequency of the reference oscillator. Provision is therefore made of a phase control and adaptation method to determine this frequency error for possible correction of the reference oscillator frequency if the frequency error is above or below a specific threshold. For this purpose, the phase variation during successive periods in a quartz oscillator start-up time is used to determine a frequency error by a derivative operation of phase deviations in these successive periods. Mainly the frequency error is obtained by a derivative of the phase variation slope after each phase realignment or several phase realignments in successive periods in at least part of the start-up time of the quartz oscillator. As mentioned previously, the reference oscillator can remain continuously switched on if there is a sufficient power supply to the oscillator system to keep it switched on.

Figure 1:
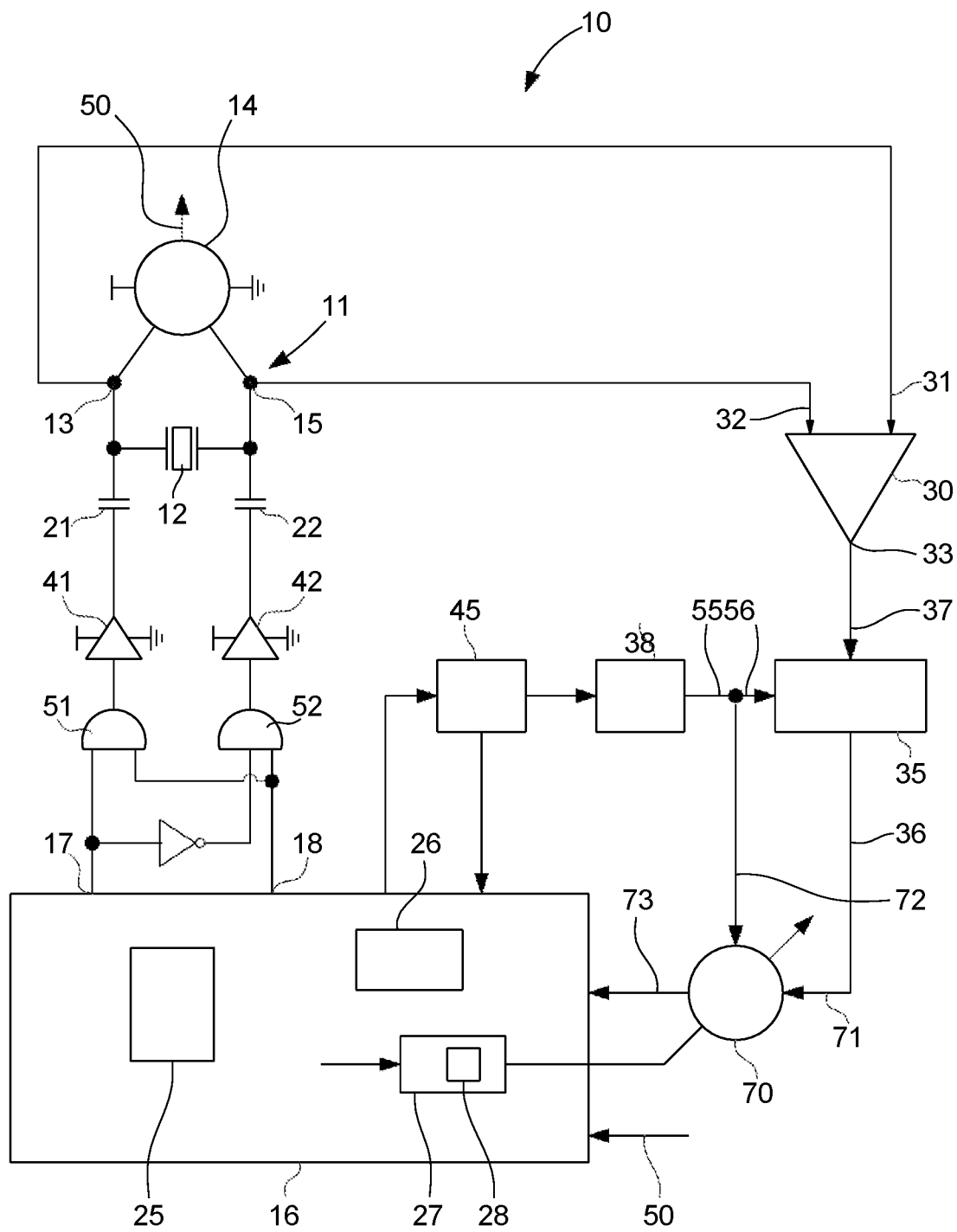
FIG. 1 shows a quartz oscillator system maintained by a prior art reference oscillator.

In prior art documents, even if the reference oscillator remains switched on continuously as shown in the oscillator system in FIG. 1, it is not at all conceivable to use the phase variation to determine and subsequently directly correct the frequency of the reference oscillator in particular in order to be within a limited margin of error with respect to the frequency of the quartz oscillator. Of course, after this start-up time all the phase values or phase variations can be memorised in a (FIFO) memory mainly integrated in the start-up controller leading to a frequency of the reference oscillator signal within an acceptable margin of error during a next start-up of the quartz oscillator. Mainly, it can be memorised in a non-volatile type memory, the error of frequencies obtained on the basis of phase variation in successive periods in the start-up time of the quartz oscillator, or after the end of the start-up of the quartz oscillator. The frequency of such a radio type quartz oscillator is generally of the order of 26 MHz or more.

It should be noted that once the quartz oscillator is fully switched on and the reference oscillator frequency has been corrected, for example to + or −1% of the quartz oscillator frequency, it is no longer necessary to make any parameter changes to guarantee the accuracy of the reference oscillator in relation to the quartz oscillator, except in the event of parameter drifts over time.

For the adapted switching on of the oscillator system, the method for operating or driving the electronic system mainly in a start-up phase with frequency adaptation based on the phase variation in each successive signal adaptation period for correcting the frequency of the reference oscillator is first described.

In more detail, the method for operating the oscillator system is described with reference to FIGS. 2 and 3. Mainly, a phase deviation is determined during the fast start-up operation of the quartz oscillator each time a phase realignment takes place in each successive period of quartz oscillator excitation signals generated by a start-up controller 16 within the fast start-up time of the quartz oscillator, or even after the end of start-up of the quartz oscillator. It may be possible to define a start-up time as a start-up parameter. This start-up time can be of the order of the millisecond ms range or even longer or shorter.

Figure 2:
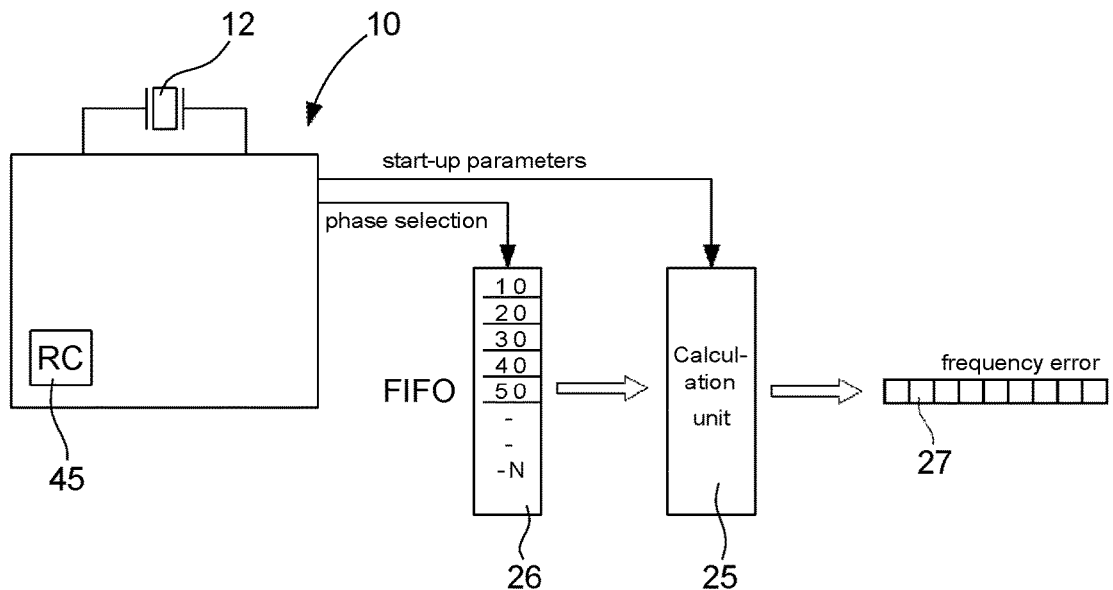
FIG. 2 shows various parts of the electronic system to describe the various steps of the method for driving the oscillator system according to the present invention, in particular to ensure fast start-up of the quartz oscillator stage so as to measure or calculate a phase deviation which can be easily used to determine a frequency error calculated in a calculation unit and to be corrected.

To describe the drive method for the oscillator system 10, reference is made to FIG. 2. The various elements of the oscillator system 10 are disposed in portions symbolising the different steps of the phase control so that a frequency error can be corrected. In the first part of the oscillator system 10, the quartz oscillator is schematically shown by its resonator 12, and the RC reference oscillator 45. The block comprising the quartz oscillator and the reference oscillator 45 is part of the start-up controller, which provides start-up parameters to a calculation unit 25, which is preferably a processor or a microcontroller. These start-up parameters relate, for example, to the excitation of the quartz oscillator to cause it to oscillate within the start-up time, and to a control of the phase deviation with respect to the reference oscillator. More specifically, these parameters are the number of drive or excitation bursts provided to the quartz oscillator, followed by the phase alignment time, and it is also intended to define the start-up time of the quartz oscillator.

A selected number of quartz oscillator drive bursts and a phase alignment time must be provided in each successive period. The number of drive or excitation bursts of the quartz oscillator can be 5 or 10 or 15 or 20 bursts in each successive start-up period. This means that the greater the number of bursts in each successive period, the greater the frequency of these bursts supplied. In addition, it is also noted that with a greater number of excitation bursts in each successive period, the amplitude of the quartz oscillator increases more rapidly than with a lesser number of excitation bursts of the quartz oscillator.

These start-up bursts can be of the order of 750 mV peak-to-peak. Several successive periods are required within a start-up time of the complete oscillator system 10, which may be set at 1 ms or even 1.5 ms, for example. From the block comprising the start-up controller, the choice of the phase value for each successive phase adaptation period is also provided. Mainly, successive phase corrections, which can be used for another quartz oscillator start-up operation, are memorised in particular in the memory 26, such as a FIFO memory. The calculation unit 25 therefore receives these phase deviations in successive periods so as to determine, based on the start-up parameters received, a frequency error calculated during the start-up of the complete oscillator system 10. The slope of the phase variation in each successive period or in several successive periods is mainly determined and this slope is derived, giving a frequency error to be corrected between the frequency of the quartz oscillator and the frequency of the reference oscillator.

FIG. 2 shows changes in phase values in this case increasing from 10 to N in pitches of 10 being added to each previous value in the memory 26 shown. But of course it is quite plausible that from a previous phase adaptation the subsequent selected phase values can decrease by pitches of less than 10 to approach an adequate phase value. And finally, the calculation unit 25 determines the frequency error to be corrected on the basis of the phase variations. The calculation unit 25 supplies the frequency error in a memory register 27 in order to adapt the oscillation frequency of the reference oscillator to the oscillation frequency of the quartz oscillator.

Figure 3:
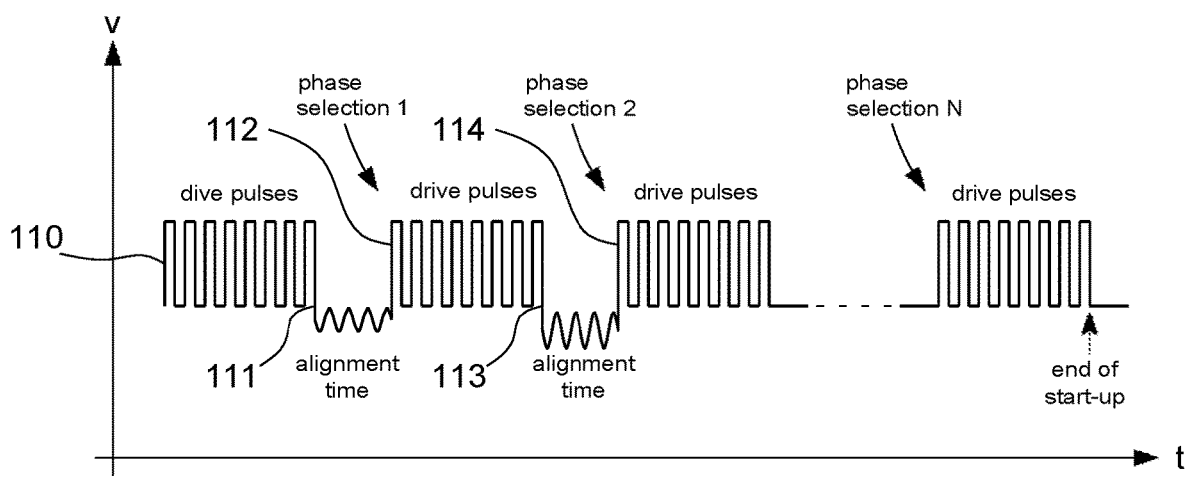
FIG. 3 shows signals generated by a drive device such as a driver of the quartz oscillator stage in a start-up phase of the oscillator system according to the present invention and wherein the reference oscillator can be power supplied continuously with phase adaptation in various successive steps so as to determine a frequency error to be corrected in order to guarantee signals from the quartz oscillator and the reference oscillator determined precisely within a determined error range.

FIG. 3 shows the generation of a sequence of several excitation signals 110, 112, 114 within the start-up time of the quartz oscillator and the phase realignment times between each group of excitation signals. In the time interval of each phase realignment, the individual oscillation signals of the quartz oscillator 111, 113 detectable between the consecutive excitation signals 110, 112, 114 can be observed. It can be seen that the oscillations of the quartz oscillator from one sequence to the next are increasing in amplitude, which is desired. The phase is realigned until the end of the defined quartz oscillator start-up time. In addition, the oscillation frequency of the reference oscillator can be corrected on the basis of the determination of the phase deviations and the derivative of the phase variation slope during the start-up of the quartz oscillator and within the defined start-up time.

Figure 4:
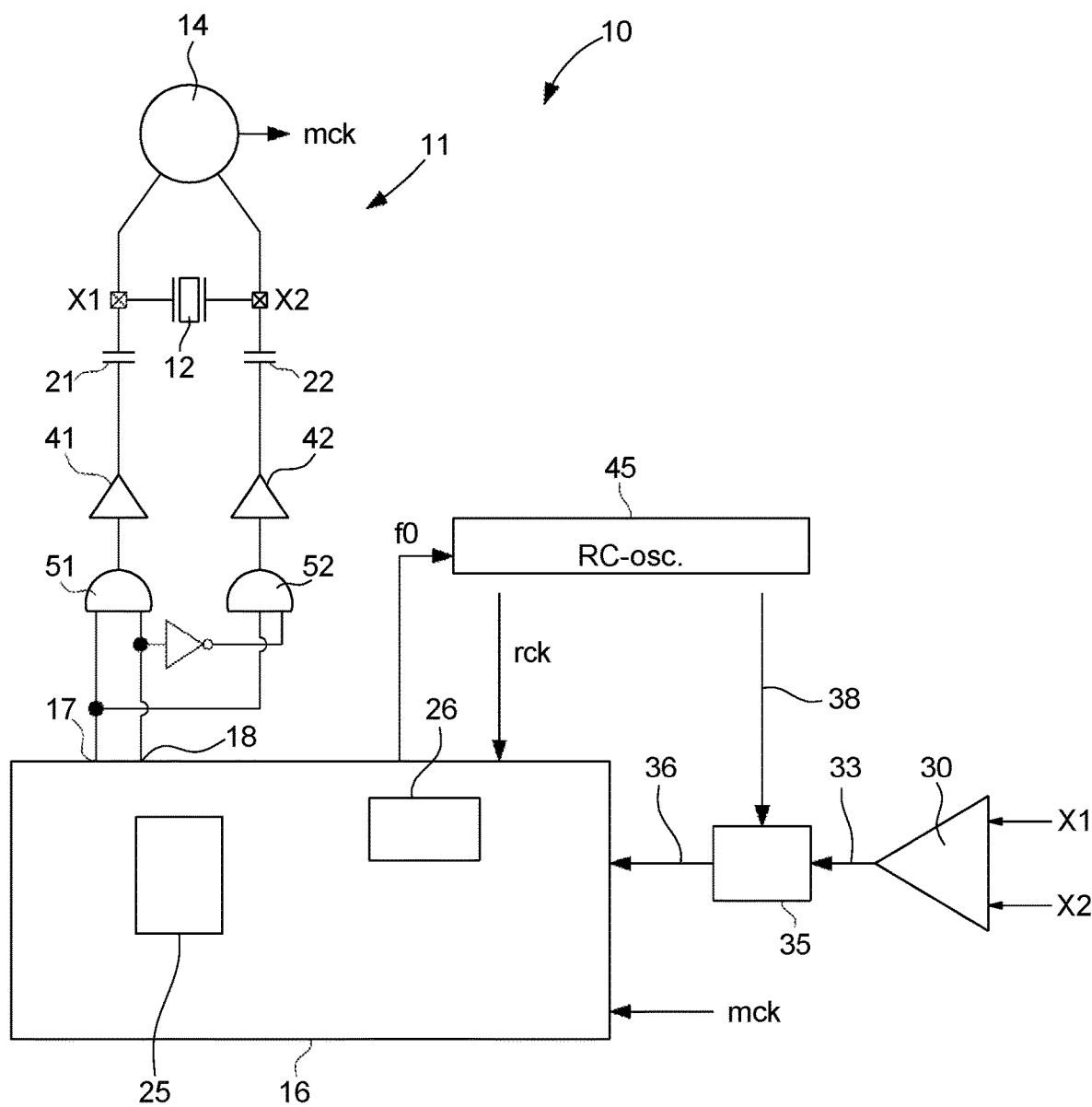
FIG. 4 shows a first embodiment of a phase-locked fast start-up oscillator system of the multi-phase analogue type of the present invention, the oscillator system comprising a multi-phase RC reference oscillator.

FIG. 4 shows a first embodiment of a fast start-up oscillator system 10 with a phase-locked loop for correcting a frequency error of the reference oscillator 45 on the basis of the quartz oscillator 11. The oscillator system 10 comprises a quartz oscillator stage 11 equivalent to that described with reference to FIG. 1 of the prior art. The frequency error correction is carried out during the start-up time of the quartz oscillator.

The oscillator 11 therefore comprises a quartz resonator 12 connected to an electronic oscillator circuit 14. The quartz resonator 12 is electrically coupled in parallel with the electronic oscillator circuit 14. The structure of the oscillator 11 comprises a first terminal X1 and a second terminal X2, which are connected to the first and second terminals of the quartz resonator 12 and the electronic oscillator circuit 14 respectively. The output terminal mck of the electronic oscillator circuit 14 is arranged to provide a master clock signal mck in order to be used by an electronic device, which may be a watch worn by a user. In the present case, the master clock signal mck is provided to a start-up controller 16, which is configured and switched on to perform a fast start-up procedure of the quartz oscillator 11 via a reference oscillator 45. As previously mentioned, the reference oscillator 45 is preferably an RC oscillator, which can generally be left in continuous operation with low power consumption. The reference oscillator 45 must at least be switched on before performing a start-up procedure on the quartz oscillator 11.

The start-up controller 16 comprises a calculation unit 25, which may be a processor 25 or microcontroller, as well as a memory unit 26 for storing data in connection with the reference oscillator 45 and for starting the quartz oscillator 11. The memory unit 26 may consist of a RAM-type memory such as a FIFO memory, for example. The oscillator system 10 comprises a comparator 30, having a first input terminal X1 connected to the first terminal of the quartz oscillator 11, and a second input terminal X2 connected to the second terminal of the quartz oscillator 11. The master clock signal mck may also be present but is mainly dedicated to the start-up controller 16.

The start-up controller 16 comprises a phase output 17 connected to first and second logic gates 51, 52, which may be AND gates. The input of the second logic gate 52 is inverted by an inverter 60 with respect to the input of the first logic gate 51. The two logic gates 51, 52 are further connected to a start-up control output 18. An output of the first and second logic gates 51, 52 is connected or coupled to the first and second buffer amplifiers 41, 42. The respective outputs of the first and second buffer amplifiers 41, 42 are connected to the first and second capacitors 21, 22. The capacitors 21, 22 are driven in a phase-shifted mode by the start-up controller 16.

The oscillator system 10 further comprises a synchroniser 35. The synchroniser 35 comprises an input terminal also referred to as a synchronisation input 33 or comparator output 30. In this way, a comparative signal indicating a comparison of the first and second oscillation signals present at the first and second terminals X1, X2 can be supplied to the synchroniser 35.

The reference oscillator 45, such as an RC oscillator, can be controlled by the start-up controller 16. Here, many frequencies or mainly phase deviations leading to the calculation of frequency errors for driving the oscillator 45 can be stored in the storage unit 26. The reference oscillator 45 normally receives a frequency signal f0 from the start-up controller 16. It also provides a time base signal rck for the start-up controller 16 and is connected to a clock input 38 of the synchroniser 35. The output terminal 36 of the synchroniser 35 is directly connected to the start-up controller 16, wherein phase deviations of the quartz oscillator signals from the reference oscillator signals are primarily determined.

As mentioned above, it is preferable to determine a phase variation rather than immediately determining a frequency error to be adapted. With the determination of the phase variation after the start-up of the quartz oscillator 11 and the reference oscillator 45 continuously in operation, the phase variation between the oscillating signal of the quartz oscillator 11 and the oscillating signal of the reference oscillator 45 is controlled in the start-up controller 16 on the basis of the output signal of the synchroniser 36. If there is a phase deviation, the corresponding frequency deviation is determined immediately by performing only a derivative of the phase deviation in the start-up controller 16. This frequency deviation relating to the phase deviation is memorised in the memory unit 26. Once the quartz oscillator 11 is maintained in oscillation and without phase variation, the stored phase deviation can be used to control the reference oscillator 45 rapidly to a known oscillation frequency. Phase realignment measurements are also carried out several times over time to maintain the frequency accuracy of the reference oscillator 45 corresponding to the frequency of the quartz oscillator within a margin of error of + or −1% of the frequency of the quartz oscillator 11.

Figure 5:
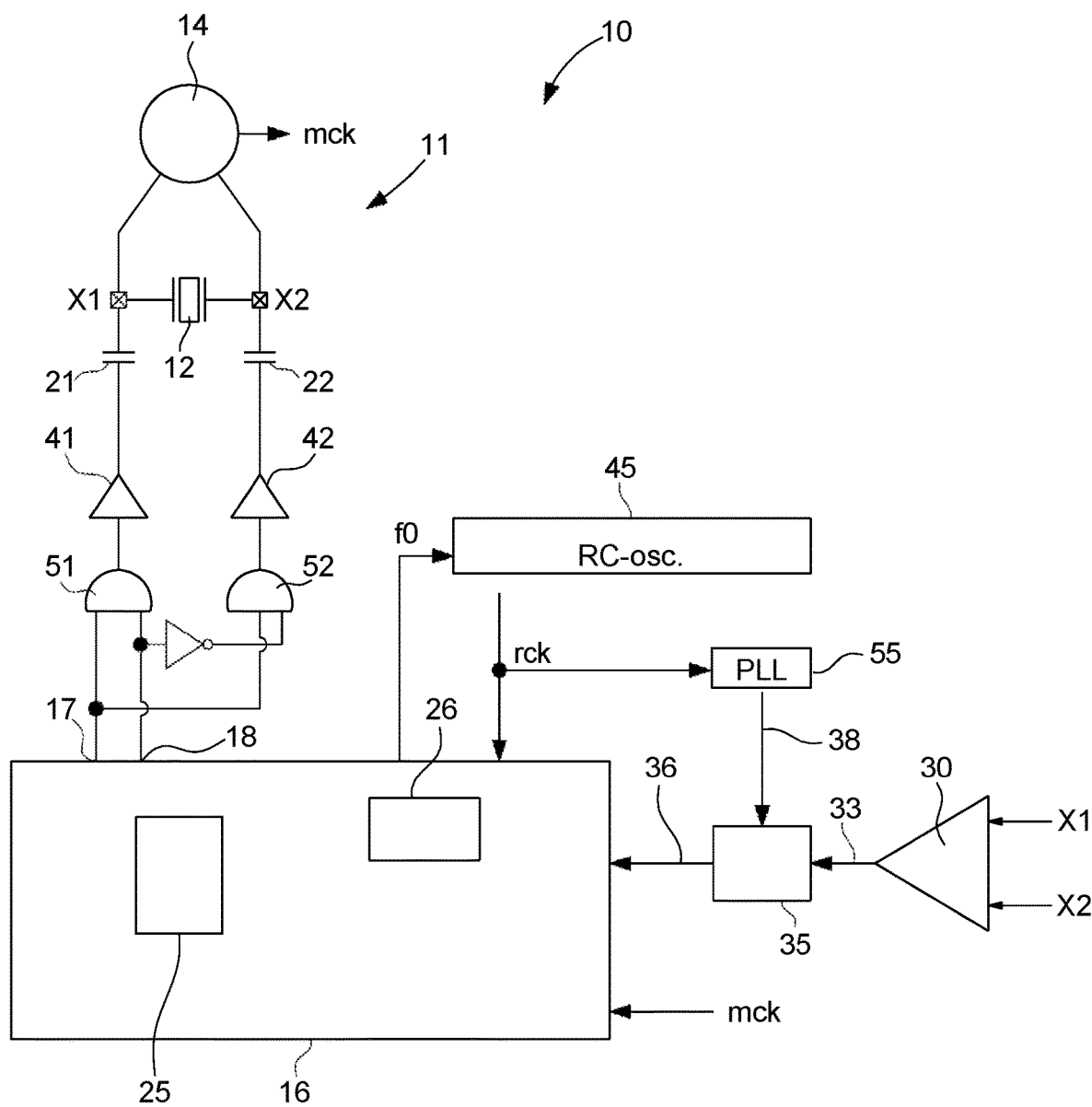
FIG. 5 shows a second embodiment of a phase-locked fast start-up oscillator system of the multi-phase digital type of the present invention, the oscillator system comprising the multi-phase RC reference oscillator with a frequency-multiplying phase-locked loop.
Figure 6:
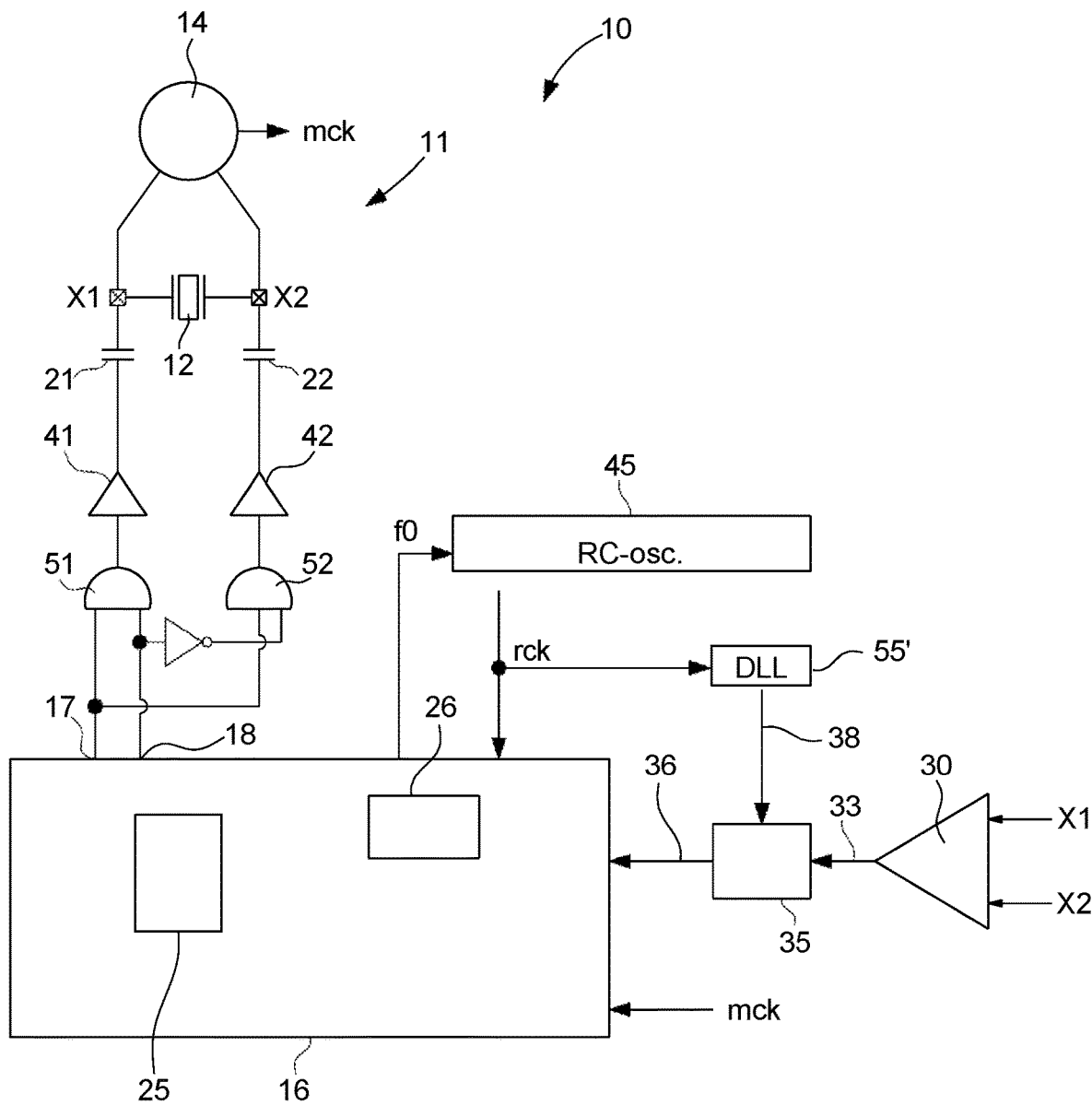
FIG. 6 shows a third embodiment of a phase-locked fast start-up oscillator system of the present invention, the oscillator system comprising the multi-phase RC reference oscillator and with a delay-locked device.

FIGS. 5 and 6 show the second and third embodiments of the oscillator system 10. All the components in FIGS. 5 and 6 will not be repeated, as the only difference from the first embodiment shown in FIG. 4 is in the clock input 38 of the synchroniser 35.

In FIG. 5, a time base signal rck from the reference oscillator 45 is supplied on the one hand to the start-up controller 16 and on the other hand to a phase-locked loop 55 (PLL), the output terminal of which is connected to the clock input 38 of the synchroniser 35.

In FIG. 6, a time base signal rck from the reference oscillator 45 is supplied on the one hand to the start-up controller 16 and on the other hand to a delay-locked loop 55' (DLL), the output terminal of which is connected to the clock input 38 of the synchroniser 35.

Figure 7:
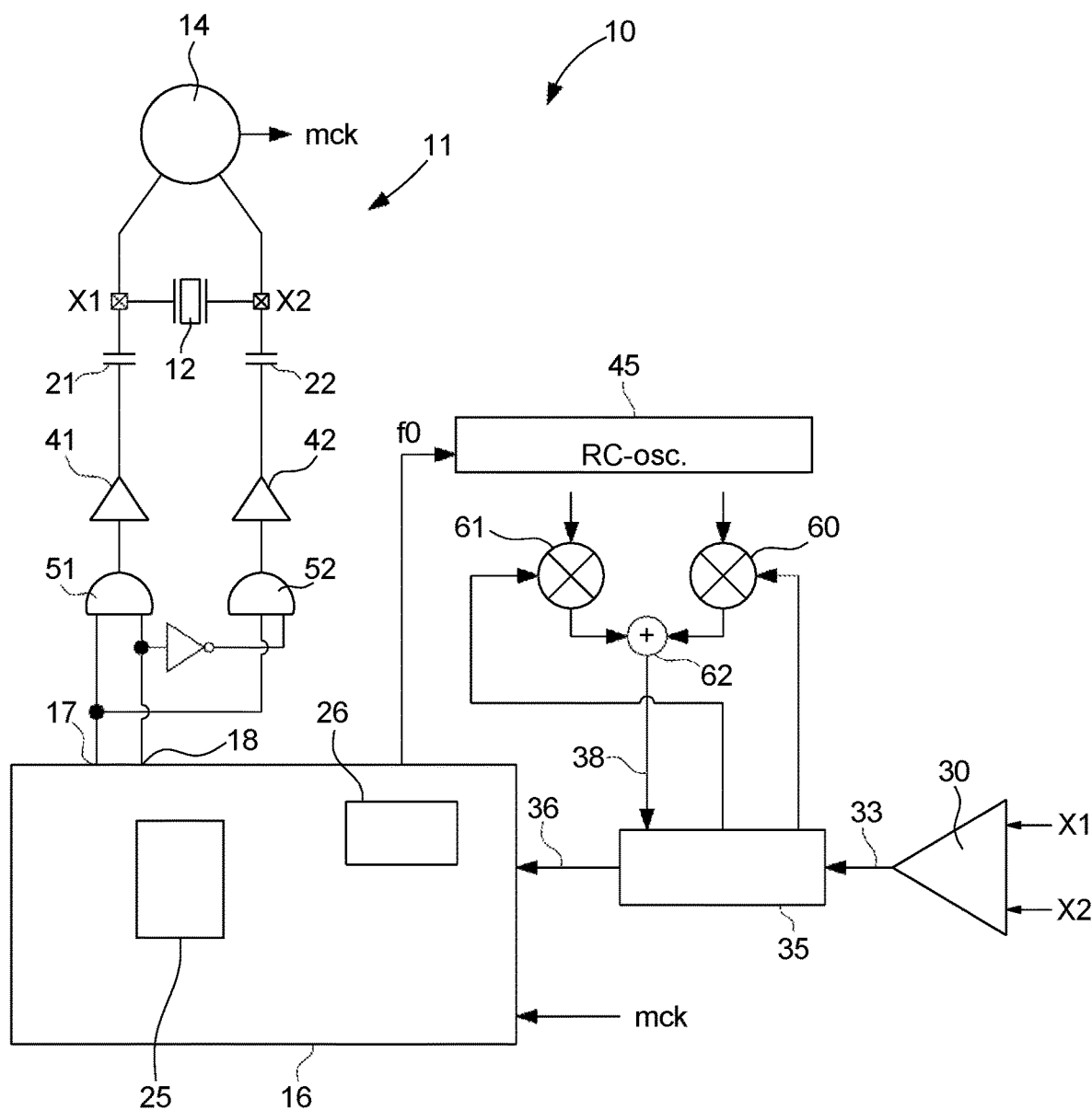
FIG. 7 shows a fourth embodiment of a phase-locked fast start-up oscillator system of the single-phase analogue type of the present invention, the oscillator system comprising an RC oscillator with a synchronisation IQ mixer.

FIG. 7 shows the fourth embodiment of the oscillator system 10 where there is only a difference in the reference oscillator 45, the synchroniser 35 and the start-up controller 16. All the other components have already been described in the first embodiment in FIG. 4 above and will therefore not be repeated for this fourth embodiment. For each of these variant embodiments, the same determination is made, in particular of the phase deviations, in order to control the reference oscillator so as to have a precise corrected frequency substantially equal to the frequency of the quartz oscillator.

FIG. 7 also shows two mixers 60, 61 receiving the time base signal rck from the reference oscillator 45, and each respectively a signal from the synchroniser 35. The output of each of these mixers 60, 61 is supplied to an adder 62, the output of which is connected to the clock input 38 of the synchroniser 35.

Of course, other possibilities for carrying out the method for operating the oscillator system and for producing the fast start-up oscillator system may be considered by the person skilled in the art without departing from the scope of the invention defined by the claims.

The invention claimed is:

1. A method for operating a fast start-up oscillator system, which comprises a reference oscillator and a quartz oscillator, which comprises a quartz resonator connected to an electronic oscillator circuit, and first and second terminals connected to the first and second terminals of the quartz resonator and the electronic oscillator circuit respectively, an output terminal of which is provided to supply a master clock signal (mck) to a start-up controller, which is configured and switched on to perform a fast start-up procedure of the quartz oscillator via the reference oscillator, the start-up controller comprising a calculation unit as well as a memory unit for storing data in connection with the reference oscillator and for starting the quartz oscillator, wherein the method comprises the following steps, during a start-up time of the quartz oscillator:
  providing start-up parameters to the calculation unit for starting the quartz oscillator, wherein the start-up parameters relate to an excitation of the quartz oscillator to cause it to oscillate within a start-up time of the quartz oscillator, and to a control of a phase deviation with respect to the reference oscillator,
  generating, in a plurality of different successive periods in the start-up time of the quartz oscillator, excitation bursts to be supplied to the quartz oscillator, to cause it to oscillate, and including a phase realignment time between each of the different successive periods,
  determining the phase deviation in each of the different successive periods between the oscillation of the reference oscillator and the oscillation of the quartz oscillator,
  calculating a frequency error in the calculation unit on the basis of the phase deviation, and
  correcting the frequency of the reference oscillator to the frequency of the quartz oscillator, within a limited margin of error.

2. The method according to claim 1, wherein the start-up time is defined before beginning the start-up of the oscillator system, or when the calculation unit is parameterised.

3. The method according to claim 2, wherein the start-up time can be adapted according to previous operations of the oscillator system, and wherein the start-up time is defined in the order of 1 ms or 1.5 ms.

4. The method according to claim 1, wherein a number of excitation bursts of the quartz oscillator is set before the oscillator system is started, or when the calculation unit is parameterised, at a value equal to 5 or 10 or 15 or 20 or more.

5. The method according to claim 1, wherein the phase realignment time, as well as a number of excitation bursts, are defined for each successive period in the start-up time, and in that in each successive period provision is first made of the defined number of excitation bursts followed by the phase realignment time.

6. The method according to claim 1, wherein the frequency error is calculated substantially at the end of the start-up time of the quartz oscillator, on the basis of the phase variation in several successive periods.

7. The method according to claim 1, wherein the reference oscillator is maintained continuously active prior to each start-up of the quartz oscillator in the oscillator system.

8. A fast start-up oscillator system comprising a reference oscillator and a quartz oscillator, which comprises a quartz resonator connected to an electronic oscillator circuit, and first and second terminals (X1, X2) connected to the first and second terminals of the quartz resonator and the electronic oscillator circuit respectively, an output terminal of which is provided to supply a master clock signal (mck) to a start-up controller, which is configured and switched on to perform a fast start-up procedure of the quartz oscillator via the reference oscillator, the start-up controller comprising a calculation unit as well as a memory unit for storing data in connection with the reference oscillator and for starting the quartz oscillator,
   wherein the reference oscillator is arranged to operate continuously so as to determine any phase deviation between the reference oscillator and the quartz oscillator in each start-up time of the oscillator system, and intended to directly determine a frequency error based on a phase variation so that it can be corrected at the end of a start-up time, and
   wherein the oscillator comprises the reference oscillator, which is an RC oscillator, intended to be left in continuous operation with low power consumption, in that the start-up controller comprises the calculation unit, which is a processor or a microcontroller, and the memory unit for storing data in connection with the reference oscillator, in that the oscillator system comprises a comparator, having a first input terminal (X1) connected to the first terminal of the quartz oscillator, and a second input terminal (X2) connected to the second terminal of the quartz oscillator, in that it comprises a synchroniser comprising a synchronisation input or comparator output, in that a frequency signal (f0) from the start-up controller is supplied to the oscillator, which is intended to supply a time base signal (rck) for the start-up controller, and is connected to a clock input of the synchroniser, and wherein the output terminal of the synchroniser is directly connected to the start-up controller, for determining phase deviations of the quartz oscillator signals from the reference oscillator signals when the oscillator system is started.

9. A fast start-up oscillator comprising a reference oscillator and a quartz oscillator, which comprises a quartz resonator connected to an electronic oscillator circuit, and first and second terminals (X1, X2) connected to the first and second terminals of the quartz resonator and the electronic oscillator circuit respectively, an output terminal of which is provided to supply a master clock signal (mck) to a start-up controller, which is configured and switched on to perform a fast start-up procedure of the quartz oscillator via the reference oscillator, the start-up controller comprising a calculation unit as well as a memory unit for storing data in connection with the reference oscillator and for starting the quartz oscillator,
   wherein the reference oscillator is arranged to operate continuously so as to determine any phase deviation between the reference oscillator and the quartz oscillator in each start-up time of the oscillator system, and intended to directly determine a frequency error based on a phase variation so that it can be corrected at the end of a start-up time, and
   wherein the oscillator comprises the reference oscillator, which is an RC oscillator, intended to be left in continuous operation with low power consumption, in that the start-up controller comprises the calculation unit, which is a processor or a microcontroller, and the memory unit for storing data in connection with the reference oscillator, in that the oscillator system comprises a comparator, having a first input terminal (X1) connected to the first terminal of the quartz oscillator, and a second input terminal (X2) connected to the second terminal of the quartz oscillator, in that it comprises a synchroniser comprising a synchronisation input or comparator output, in that a frequency signal (f0) from the start-up controller is supplied to the oscillator, which is intended to supply a time base signal (rck) on the one hand to the start-up controller and on the other hand to a phase-locked loop, the output terminal of which is connected to a clock input of the synchroniser, and wherein the output terminal of the synchroniser is directly connected to the start-up controller for determining phase deviations of the quartz oscillator signals from the reference oscillator signals when the oscillator system is started.

10. A fast start-up oscillator system comprising a reference oscillator and a quartz oscillator, which comprises a quartz resonator connected to an electronic oscillator circuit, and first and second terminals (X1, X2) connected to the first and second terminals of the quartz resonator and the electronic oscillator circuit respectively, an output terminal of which is provided to supply a master clock signal (mck) to a start-up controller, which is configured and switched on to perform a fast start-up procedure of the quartz oscillator via the reference oscillator, the start-up controller comprising a calculation unit as well as a memory unit for storing data in connection with the reference oscillator and for starting the quartz oscillator,
   wherein the reference oscillator is arranged to operate continuously so as to determine any phase deviation between the reference oscillator and the quartz oscillator in each start-up time of the oscillator system, and intended to directly determine a frequency error based on a phase variation so that it can be corrected at the end of a start-up time, and
   wherein the oscillator comprises the reference oscillator, which is an RC oscillator, intended to be left in continuous operation with low power consumption, in that the start-up controller comprises the calculation unit, which is a processor or a microcontroller, and the memory unit for storing data in connection with the reference oscillator, in that the oscillator system comprises a comparator, having a first input terminal (X1) connected to the first terminal of the quartz oscillator, and a second input terminal (X2) connected to the second terminal of the quartz oscillator, in that it comprises a synchroniser comprising a synchronisation input or comparator output, in that a frequency signal (f0) from the start-up controller is supplied to the oscillator, which is intended to supply a time base signal (rck) on the one hand to the start-up controller and on the other hand to a delay-locked loop, the output terminal of which is connected to a clock input of the synchroniser, and wherein the output terminal of the synchroniser is directly connected to the start-up controller for determining phase deviations of the quartz oscillator signals from the reference oscillator signals when the oscillator system is started.

11. A fast start-up oscillator system comprising a reference oscillator and a quartz oscillator, which comprises a quartz resonator connected to an electronic oscillator circuit, and first and second terminals (X1, X2) connected to the first and second terminals of the quartz resonator and the electronic oscillator circuit respectively, an output terminal of which is provided to supply a master clock signal (mck) to a start-up controller, which is configured and switched on to perform a fast start-up procedure of the quartz oscillator via the reference oscillator, the start-up controller comprising a calculation unit as well as a memory unit for storing data in connection with the reference oscillator and for starting the quartz oscillator, wherein the reference oscillator is arranged to operate continuously so as to determine any phase deviation between the reference oscillator and the quartz oscillator in each start-up time of the oscillator system, and intended to directly determine a frequency error based on a phase variation so that it can be corrected at the end of a start-up time, and wherein the oscillator comprises the reference oscillator, which is an RC oscillator with a synchronisation IQ mixer, intended to be left in continuous operation with low power consumption, in that the start-up controller comprises the calculation unit, which is a processor or a microcontroller, and the memory unit for storing data in connection with the reference oscillator, in that the oscillator system comprises a comparator, having a first input terminal (X1) connected to the first terminal of the quartz oscillator, and a second input terminal (X2) connected to the second terminal of the quartz oscillator, in that it comprises a synchroniser comprising a synchronisation input or comparator output, in that a frequency signal (f0) from the start-up controller is supplied to the oscillator, in that it comprises two mixers for receiving a time base signal (rck) from the reference oscillator, and each respectively a signal from the synchroniser, in that the output of each of the mixers is supplied to an adder, the output of which is connected to the clock input of the synchroniser, and wherein the output terminal of the synchroniser is directly connected to the start-up controller for determining phase deviations of the quartz oscillator signals from the reference oscillator signals when the oscillator system is started up.

\* \* \* \* \*